United States Patent [19]

Ueda et al.

[11] Patent Number: 4,958,781
[45] Date of Patent: Sep. 25, 1990

[54] CASSETTE FOR PHOTO-SENSISTIVE RECORDING MEDIUM

[75] Inventors: Masashi Ueda; Kazumasa Makino, both of Nagoya; Yumio Matsumoto, Kasugai; Akira Sago, Nagoya; Kiyoharu Hayakawa, Ama; Osamu Takagi, Nagoya, all of Japan

[73] Assignee: Brother Kogyo Kabushiki Kaisha, Aichi, Japan

[21] Appl. No.: 279,445

[22] Filed: Dec. 2, 1988

[30] Foreign Application Priority Data

Dec. 15, 1987 [JP] Japan ................................. 62-191007
May 30, 1988 [JP] Japan ................................. 63-72826
May 30, 1988 [JP] Japan ................................. 63-72827

[51] Int. Cl.⁵ .............................................. G03B 1/04
[52] U.S. Cl. .................................. 242/71.7; 242/71.2; 352/78 R
[58] Field of Search ................................ 242/71–71.7; 354/275; 206/389, 395, 409; 352/78 R

[56] References Cited

U.S. PATENT DOCUMENTS 3,690,451  9/1972  Nerwin .......................... 242/71.2 X
3,980,254  9/1976  Coon et al. .................... 352/78 R
4,212,389  7/1980  Robbins ........................ 242/71.1 X
4,420,120 12/1983  Raymond ....................... 242/71.7
4,705,375 11/1987  Kirigaya et al. ............... 352/78 R X Primary Examiner—Stuart S. Levy
Assistant Examiner—Steven M. duBois
Attorney, Agent, or Firm—Kane, Dalsimer, Sullivan, Kurucz, Levy, Eisele and Richard

[57] ABSTRACT

In a cassette for accommodating therein a photo-sensitive recording medium, a pair of cassette halves formed of synthetic resin are united together to form a cassette body having defined therein an accommodating chamber for the recording medium. A drawing opening is formed in an outer surface of the cassette body. The recording medium is drawn out of the accommodating chamber through the drawing opening. An optically inert feed passage is defined by cooperation of a wall section of one of the pair of cassette halves with a wall section of the other cassette half when the one and other cassette halves are united together. The feed passage has one end thereof communicating with the accommodating chamber and the other end communicating with the drawing opening such that the recording medium passes through the feed passage when the recording medium is drawn out of the accommodating chamber through the drawing opening.

19 Claims, 5 Drawing Sheets

CASSETTE FOR PHOTO-SENSISTIVE RECORDING MEDIUM

BACKGROUND OF THE INVENTION

This invention relates to a cassette for accommodating therein a photo-sensitive recording medium.

Japanese Utility Model Application No. 61-154168 filed on Oct. 7, 1987 in the name of the same assignee as the present application discloses a cassette for a photo and pressure sensitive recording medium wound into a roll. The cassette is formed in its peripheral wall with a drawing opening through which the recording medium is drawn out of the cassette. A decharging brush is provided which extends along a peripheral edge of the drawing opening. The de-charging brush serves to prevent natural light from being penetrated into the cassette. The de-charging brush also serves to prevent static electricity from being generated due to sliding contact of the recording medium with the peripheral edge of the drawing opening, thereby avoiding a malfunction of an electronic system of an exposure unit incorporated in an image recording apparatus such as a printer, a copying machine and the like.

However, the de-charging brush fails to sufficiently shield the light from being penetrated into the cassette thereby exposing the recording medium within the cassette to the penetrated light unintentionally.

SUMMARY OF THE INVENTION

It is therefore an object of this invention to provide an improved cassette for accommodating a photo-sensitive recording medium, capable of preventing light from being penetrated into the cassette, by a simple construction, thereby avoiding unintentional exposure of the recording medium to the light.

For the above purpose, according to the invention, there is provided a cassette for accommodating therein a photo-sensitive recording medium, which comprises:

a pair of cassette halves formed of synthetic resin, the pair of cassette halves being united together to form a cassette body having defined therein an accommodating chamber for the recording medium;

a drawing opening formed in an outer surface of the cassette body, the recording medium being drawn out of the accommodating chamber through the drawing opening; and an optically inert feed passage defined by cooperation of a wall section of one of the pair of cassette halves with a wall section of the other cassette half when the one and other cassette halves are united together, the feed passage having one end thereof communicating with the accommodating chamber and the other end communicating with the drawing opening such that the recording medium passes through the feed passage when the recording medium is drawn out of the accommodating chamber through the drawing opening.

BRIEF DESCRIPTION OF THE ACCOMPANYING DRAWINGS

DESCRIPTION OF THE EMBODIMENTS

Figure 1:
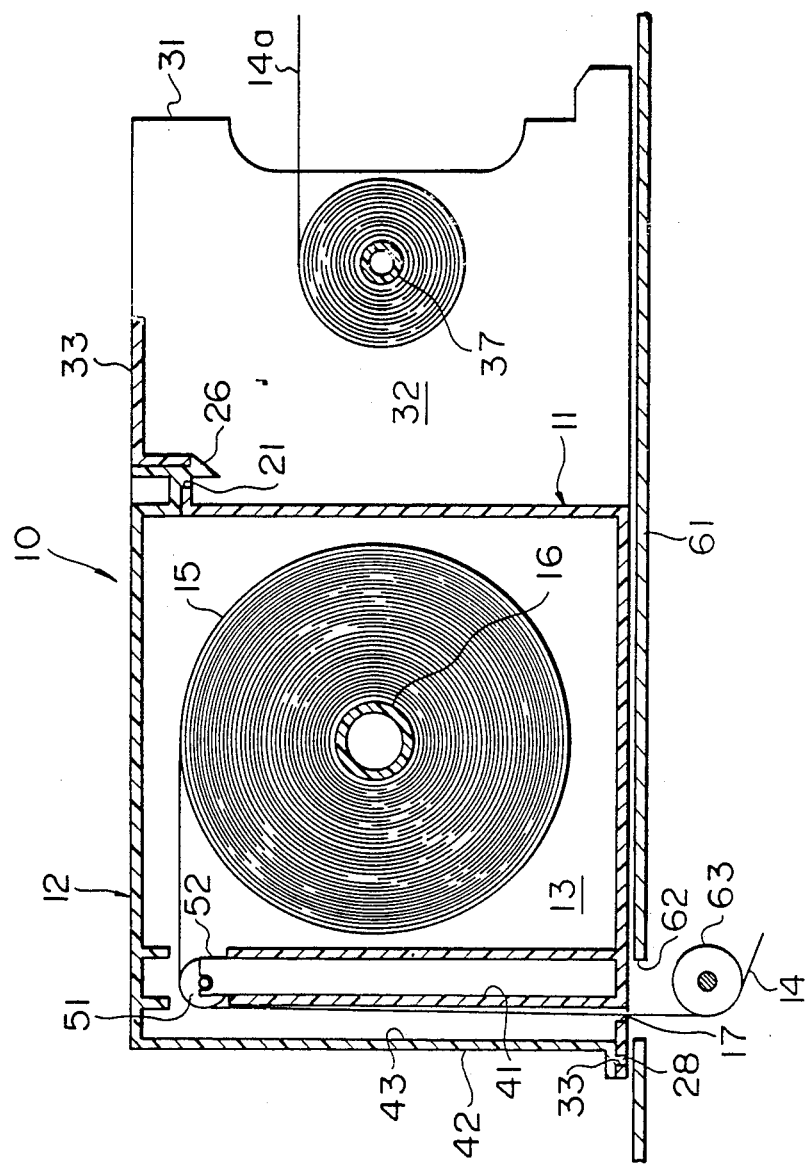
FIG. 1 is a somewhat schematic enlarged cross-sectional view of a cassette embodying the invention.
Figure 2:
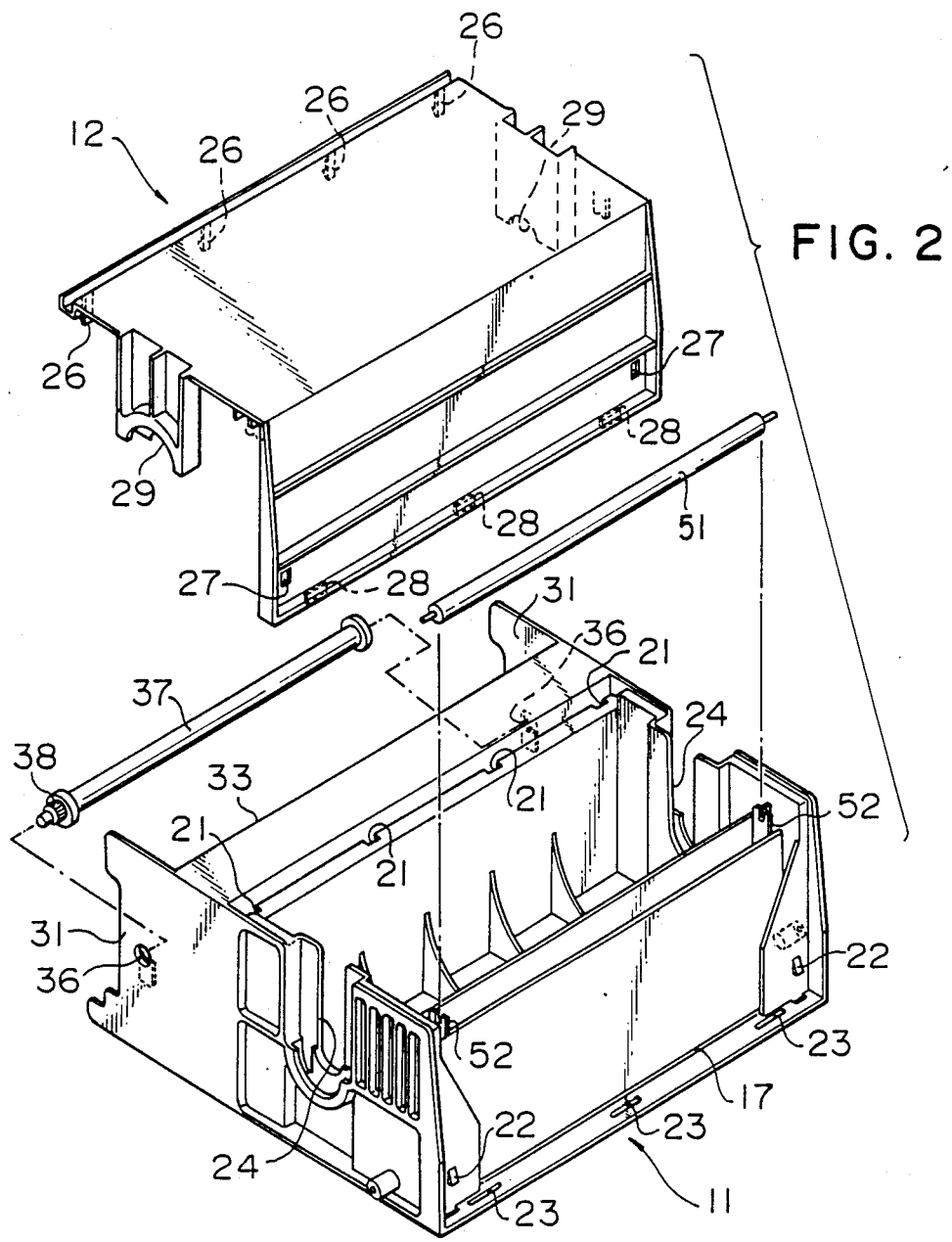
FIG. 2 is an exploded perspective view of the cassette illustrated in FIG. 1.

Referring to FIGS. 1 and 2, there is shown a cassette for accommodating therein a photo-sensitive recording medium, embodying the invention. The recording medium employed in the illustrated embodiment is of type which has been proposed in U.S. Pat. No. 4,399,209.

As shown in FIG. 1, the cassette comprises a pair of cassette halves 11 and 12 formed of synthetic resin. The pair of cassette halves 11 and 12 are united together to form a cassette body 10 generally in the form of a rectangular parallelopiped having six walls. The pair of cassette halves 11 and 12 cooperate with each other to define an accommodating chamber 13 within the cassette body 10. The accommodating chamber 13 serves to accommodate the above-mentioned photo-sensitive recording medium which is in the form of a continuous web 14 wound into a roll 15 about an uncoiler core 16. One of the pair of cassette halves 11 is formed therein with a drawing opening 17 through which an unused portion of the continuous web 14 is drawn out of the accommodating chamber 13.

As shown in FIG. 2, the one cassette half 11 is formed with a plurality of latching bores 21, a pair of pawls 22, a plurality of fitting bores 23 and a pair of grooves 24. On the other hand, the other cassette half 12 is formed with a plurality of latching pawls 26, a pair of engaging bores 27, a plurality of projections 28 and a pair of semi-circular recesses 29. When the pair of cassette halves 11 and 12 are united together as shown in FIG. 1, the latching pawls 26 of the other cassette half 12 are snap-fitted respectively into the latching bores 21 of the one cassette half 11. The projections 28 of the other cassette half 12 are fitted respectively into the fitting bores 23 in the one cassette half 11. Further, the pawls 22 of the one cassette half 11 are snap-fitted respectively into the engaging bores 27 of the other cassette half 12. Moreover, the pair of grooves 24 and 24 of the one cassette half 11 cooperate respectively with the pair of semi-circular recesses 29 and 29 of the other cassette half 12 to rotatably support the opposite axial ends of the aforesaid uncoiler core 16.

Referring again to FIG. 2, the one cassette half 11 has a pair of opposed, but spaced extension support wall sections 31 and 31 formed in integral relation to the one cassette half 11. The pair of support wall sections 31 and 31 cooperate with each other to define therebetween an open space 32 (see FIG. 1). A connecting wall section 33 extends between the pair of support wall sections 31 and 31 in integral relation thereto. The support wall sections 31 and 31 are formed therein with their respective support bores 36 and 36. A recoiler core 37 for taking up a used portion 14a (see FIG. 1) of the continuous web 14 has opposite axial ends which are rotatably fitted respectively in the support bores 36 and 36. Thus, the recoiler core 37 is rotatably supported by the support wall sections 31 and 31 in such a manner that an axis of the recoiler core 37 extends parallel to an axis of the roll 15 or an axis of the uncoiler core 16. A gear wheel 38 is mounted on the recoiler core 37 for rotation therewith. The gear wheel 38 is adapted to be drivingly connected to a drive motor through a gear train (both not shown).

Referring back to FIG. 1, one of the six walls of the cassette body 10 is constituted by a wall section 41 of the one cassette half 11 and a wall section 42 of the other cassette half 12. The wall sections 41 and 42 cooperate with each other to define therebetween an optically inert feed passage 43 which extends straight. The feed passage 43 has one end thereof communicating with the accommodating chamber 13. The other end of the feed passage 43 communicates with the drawing opening 17. Thus, when the leading edge portion of the continuous web 14 is drawn out of the accommodating chamber 13 through the drawing opening 17, the leading edge portion passes through the feed passage 43. The feed passage 43 is inert optically and has its length so sufficient as to prevent light penetrated through the drawing opening 17, from reaching the accommodating chamber 13.

A guide roller 51 is rotatably supported by a pair of brackets 52 and 52 (see FIG. 2) and is arranged at connection between the feed passage 43 and the accommodating chamber 13. The guide roller 51 serves to guide the continuous web 14 drawn from the drawing opening 17 through the feed passage 43.

When the cassette body 10 is assembled, the one and other cassette halves 11 and 12 are united together in such a manner that the opposite ends of the uncoiler core 16, about which the unused continuous web 14 is wound into the roll 15, are clamped respectively between the grooves 24 and 24 of the one cassette half 11 and the semi-circular recesses 29 and 29 of the other cassette half 12. This assembling operation is carried out in a light-shielded working environment. Subsequently, in a normal or usual working environment, the opposite axial ends of the recoiler core 37 are fitted respectively into the support bores 36 and 36 formed respectively in the support wall sections 31 and 31 of the one cassette half 11, while slightly pushing the support wall sections 31 and 31 away from each other. Thus, the recoiler core 37 is rotatably supported by the support wall sections 31 and 31. In this manner, the mounting operation of the recoiler core 37 can be effected independently of the assembling operation of the one and other cassette halves 11 and 12 together with the uncoiler core 16 about which the unused continuous web 14 is wound into the roll 15. Accordingly, the mounting operation of the recoiler core 37 can be facilitated and, in addition thereto, it is not required to carry out the mounting operation of the recoiler core 37 in a light-shielded environment unlike the assembling of the one and other cassette halves 11 and 12 together with the uncoiler core 16.

In use, the cassette is incorporated in an image recording apparatus, and is mounted on a wall of a body 61 of the apparatus, as shown in FIG. 1, such that the drawing opening 17 of the cassette body 10 is aligned with an opening 62 formed in the wall of the body 61. A guide roller 63 is arranged at the opening 62 for guiding the unused portion of the continuous web 14 into an exposure station of the apparatus. The used portion 14a of the continuous web 14, which has been exposed to light at the exposure station of the apparatus, is taken up about the recoiler core 37 rotatively driven by the drive motor through the gear train in mesh with the gear wheel 38 mounted on the recoiler core 37.

During storage or transportation of the cassette before the use thereof with the image recording apparatus, light tends to be penetrated into the accommodating chamber 13 of the cassette body 10 through the drawing opening 17. However, the feed passage 43, which is inert optically, effectively prevents the light penetrated through the drawing opening 17, from reaching the accommodating chamber 13, thereby ensuring that the roll 15 of the continuous web 14 within the accommodating chamber 13 is prevented from being exposed to the penetrated light unintentionally.

It is to be understood that, although the pair of support wall sections 31 and 31 and the connecting wall section 33 have been described as being formed in integral relation to the one cassette half 11, these wall sections may be formed in integral relation to the other cassette half 12.

As described above with reference to FIGS. 1 and 2, the optically inert feed passage 43 effectively avoids penetration of light into the accommodating chamber 13, making it possible to ensure prevention of natural light-exposure of the roll 15 of the continuous web 14 within the accommodating chamber 13. Further, the feed passage 43 preventing ingress of light into the accommodating chamber 13 is defined simply by the wall sections 41 and 42 of the respective cassette halves 11 and 12 when they are united together and, in addition thereto, the pair of cassette halves 11 and 12 are formed of synthetic resin. Thus, the cassette can be manufactured at relatively low cost.

Figure 3:
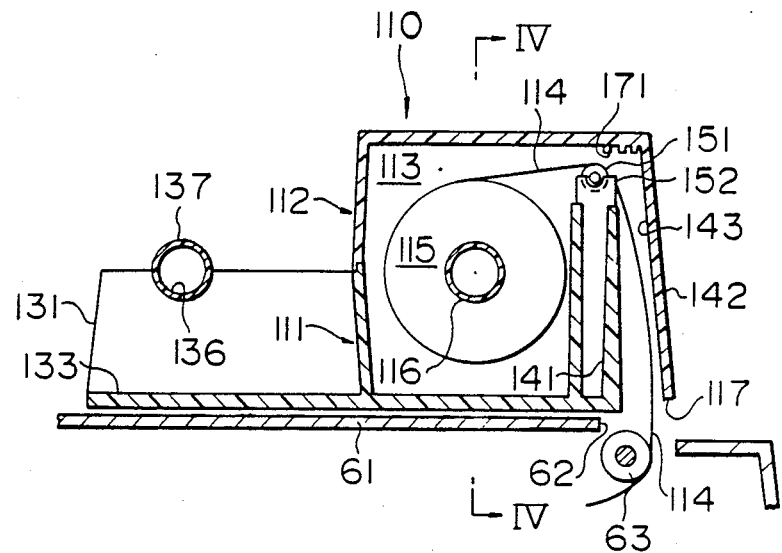
FIG. 3 is a fragmentary cross-sectional view of a modified cassette.
Figure 4:
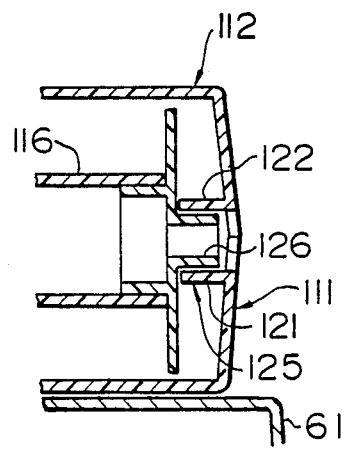
FIG. 4 is a cross-sectional view taken along the line IV—IV in FIG. 3.
Figure 5:
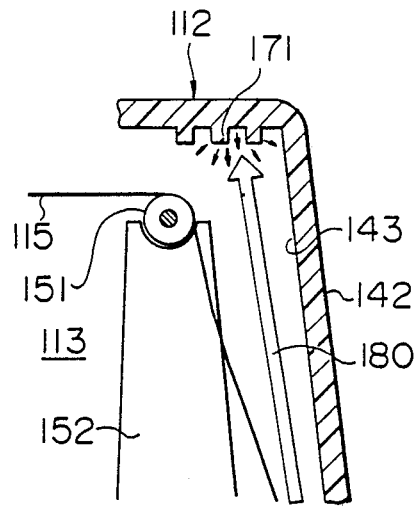
FIG. 5 is a fragmentary enlarged cross-sectional view of a diffused-reflector illustrated in FIG. 3.

Referring next to FIGS. 3 through 5, there is shown a modified cassette for accommodating therein the aforesaid photo-sensitive recording medium.

As shown in FIG. 3, the cassette comprises a pair of cassette halves 111 and 112 formed of synthetic resin. The pair of cassette halves 111 and 112 are united together in a manner like the previous cassette body 10, to form a cassette body 110 having defined therein an accommodating chamber 113 for the recording medium in the form of a continuous web 114 wound into a roll 115 about an uncoiler core 116. The pair of cassette halves 111 and 112 cooperate with each other to define a drawing opening 117 through which the unused continuous web 114 is drawn out of the accommodating chamber 113.

As shown in FIG. 4, the one cassette half 111 is integrally formed with a pair of semi-circular flanges 121 (only one shown) which extend toward each other. Likewise, the other cassette half 112 is integrally formed with a pair of semi-circular flanges 122 (only one shown) extending toward each other. When one and other cassette halves 111 and 112 are united together, the pair of semi-circular flanges 121 and the pair of semi-circular flanges 122 cooperate respectively with each other to form a pair of bearing sections 125 (only one shown) or rotatably supporting respectively a pair of end shaft members 126 fitted respectively in the opposite axial ends of the uncoiler core 116.

Like the cassette illustrated in FIGS. 1 and 2, the one cassette half 111 shown in FIG. 3 has a pair of opposed, but spaced extension support wall sections 131 (only one shown) integral with the one cassette half 111. A connecting wall section 133 extends between the pair of support wall sections 131 in integral relation thereto. The support wall sections 131 are formed with their respective semi-circular recesses 136 (only one shown) for rotatably supporting respectively opposite axial ends of a recoiler 137 for taking up a used portion of the continuous web 114. The recoiler core 137 is rotatably supported by the support wall sections 131 in parallel relation to the uncoiler core 116.

Like the previously-described cassette body 10, a wall section 141 of the one cassette half 111 and a wall section 142 of the other cassette half 112 cooperate with each other to define therebetween an optically inert feed passage 143 for bringing the accommodating chamber 113 into communication with the drawing opening 117. The feed passage 143 is inert optically and has its length so sufficient as to prevent light penetrated through the drawing opening 117, from reaching the accommodating chamber 113.

A guide roller 151 is rotatably supported by a pair of brackets 152 and is arranged at connection between the feed passage 143 and the accommodating chamber 113. Adjacent the guide roller 151, in order words, adjacent the connection between the feed passage 143 and the accommodating chamber 113, a diffused-reflector 171 is arranged for diffusedly reflecting light penetrated into the feed passage 143 through the drawing opening 117, thereby attenuating the light. In the modification illustrated in FIG. 3, the diffused-reflector 171 is constituted by irregularities which are formed in an integral manner on an inner wall surface of the other cassette half 111. The irregularities of the diffused-reflector 171 may be coarse or fine and may take any pattern such as a striped pattern, a checkered pattern, a corrugated pattern, a saw-tooth pattern or the like.

The diffused-reflector 171 is arranged at a location where light penetrated into the feed passage 143 through the drawing opening 117 is reflected first by the diffused-reflector 171, that is, at a location adjacent the connection between the feed passage 143 and the accommodating chamber 113, in other words, at a location where the continuous web 114 is changed in direction by the guide roller 151. In this manner, the diffused-reflector 171 may be arranged at any optional location. It is desirable, however, that the diffused-reflector 171 is arranged at a location where the diffused-reflector 171 is illuminated directly with the light penetrated into the feed passage 143 through the drawing opening 117. It is needless to say that a plurality of diffused-reflectors may be arranged respectively at a plurality of locations.

As shown in FIG. 5, light 180 is penetrated into the feed passage 143 through the drawing opening 117 (see FIG. 3). However, the light 180 is diffusedly reflected, as indicated by the arrows, by the irregularities of the diffused-reflector 171 formed on the inner wall surface of the other cassette half 111. Accordingly, the penetrated light is attenuated sufficiently, making it possible to prevent natural light-exposure of the roll 116 of the continuous web 115 within the accommodating chamber 113.

As described above with reference to FIGS. 3 through 5, the diffused-reflector 171 associated with the feed passage 143 can diffusedly reflect the light penetrated into the feed passage 143 through the drawing opening 117 to sufficiently attenuate the penetrated light, making it possible to prevent natural light-exposure of the roll 115 of the continuous web 114. Thus, it can be ensured to maintain the image quality of the continuous web 114 and to use the same in a stable manner.

Figure 6:
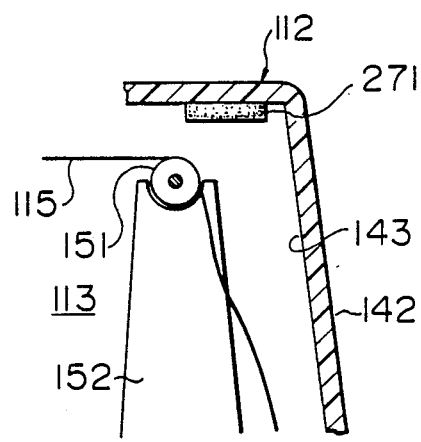
FIG. 6 is a view similar to FIG. 5, but showing a modified diffused-reflector.

The above-mentioned diffused-reflector may be formed of spongy material 271 as shown in FIG. 6, which is adhesively bonded to the inner wall surface of the other cassette half 111 at the location adjacent the connection between the feed passage 143 and the accommodating chamber 113.

Figure 7:
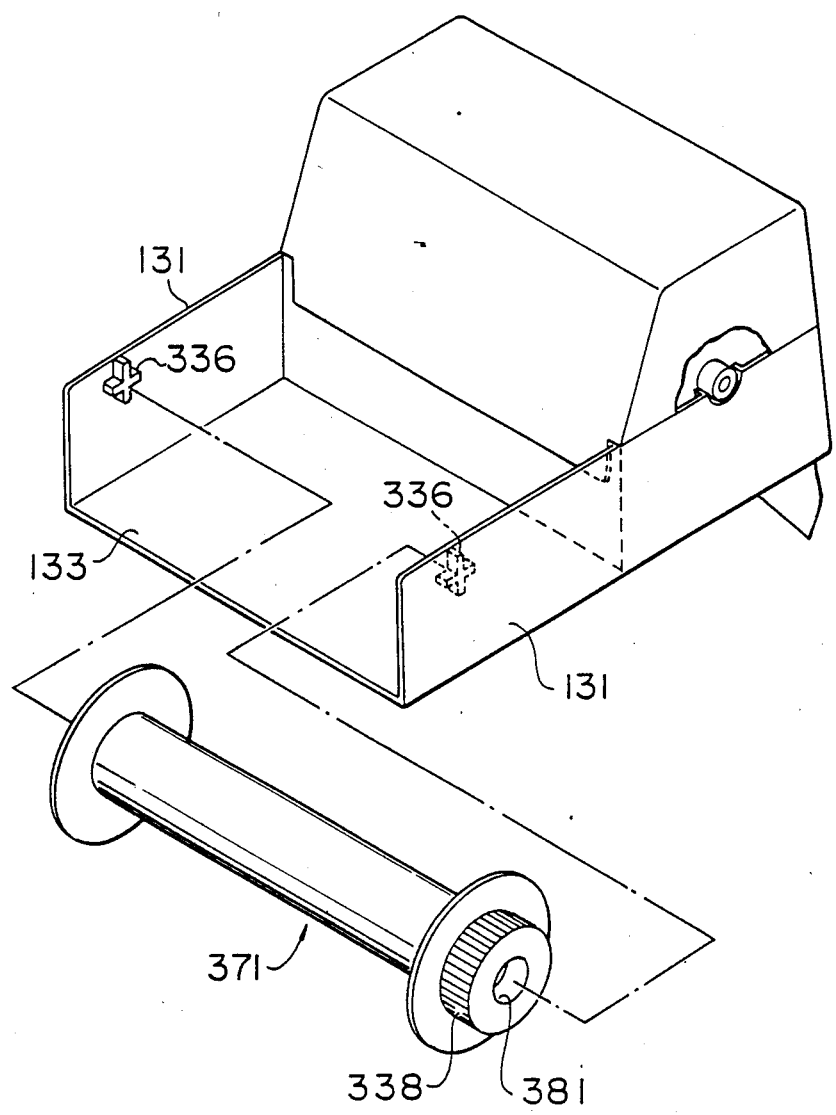
FIG. 7 is is a perspective view of a cassette provided with a modified support structure for a recoiler core.

FIG. 7 shows a modified support structure for a recoiler core 371. In FIG. 7, components and parts like or similar to those illustrated in FIG. 3 are designated by the same or similar reference numerals, and the description of such like or similar components and parts will therefore be omitted to avoid repetition.

As shown in FIG. 7, a pair of cruciform ribs 336 and 336 are fixedly mounted respectively to the inner surfaces of the respective support wall sections 131 and 131. On the other hand, the recoiler core 371 has its opposite axial end faces which are formed therein with respective bores 381 (only are shown). The recoiler core 371 is rotatably supported by the pair of support wall sections 131 and 131 in such a manner that the pair of ribs 336 and 336 are fitted, with a slight play, respectively into the bores 381 in the respective axial end faces of the recoiler core 371. One of the opposite axial ends of the recoiler core 371 is formed with gear teeth 338 the same in function as the gear wheel 38 of the recoiler 37 illustrated in FIG. 2.

What is claimed is:

1. A cassette for accommodating therein a photosensitive recording medium, said cassette comprising:
a pair of cassette halves formed of a synethetic resin, said pair of cassette halves being united together to form a rectangular parallelopiped cassette body having six walls and having defined therein an accommodating chamber for said recording medium;
a drawing opening formed in an outer surface of said cassette body, said recording medium being drawn out of said accommodating chamber through said drawing opening: and
and optically inert, substantially straight feed passage defined by cooperation of a wall section of one of said pair of cassette halves with a wall section of the other of said pair of cassette halves when said cassette halves are united together, said wall sections forming one of said cassette body six walls, said feed passage having one end thereof communicating with said accommodating chamber and the other end communicating with said drawing opening such that said recording medium passes through said feed passage when said recording medium is drawn out of said accommodating chamber through said drawing opening.

2. The cassette according to claim 1, wherein said feed passage has its length so sufficient as to prevent light from being penetrated into said accommodating chamber from said drawing opening through said feed passage.

3. The cassette according to claim 1, wherein said recording medium is in the form of a continuous web wound into a roll which is accommodated in said accommodating chamber, said continuous web having a leading edge portion which extends from said accommodating chamber to said drawing opening through said feed passage.

4. The cassette according to claim 3, further comprising a recoiler core rotatably mounted to said cassette body for taking up a used portion of said continuous web, said uncoiler core having an axis extending parallel to an axis of said roll.

5. The cassette according to claim 1, further comprising a guide roller arranged at said one end of said feed passage for guiding said recording medium drawn from said drawing opening through said feed passage.

6. The cassette according to claim 1, wherein said accommodating chamber is defined by cooperation of said one cassette half with said other cassette half when said one and other cassette halves are united together.

7. The cassette according to claim 1, wherein said drawing opening is formed in one of said pair of cassette halves.

8. The cassette according to claim 1, wherein said one cassette half is formed therein with a plurality of bores, while said other cassette half is formed thereon with a plurality of projections fitted respectively into said bores.

9. The cassette according to claim 1, further comprising diffused-reflection means associated with said feed passage for diffusedly reflecting light penetrated into said feed passage through said drawing opening, thereby attenuating the light.

10. The cassette according to claim 9, wherein said diffused-reflection means is defined by a non-planar surface formed by a plurality of irregularities.

11. The cassette according to claim 9, wherein said diffused-reflection means is formed of spongy material.

12. The cassette according to claim 4, wherein said cassette body has a pair of opposed, but spaced support wall sections which cooperate with each other to define therebetween an open space, and wherein said recoiler core has its opposite axial ends which are rotatably supported respectively by said pair of support wall sections.

13. The cassette according to claim 12, wherein said pair of support wall sections are formed therein with their respective recesses, and wherein said recoiler core has its opposite axial ends which are rotatably received respectively in said recesses.

14. The cassette according to claim 12, wherein said pair of support wall sections are formed therein with their respective projection means extending toward each other, and wherein said recoiler core has its opposite axial end faces formed therein with respective bores, said recoiler core being rotatably supported by said pair of support wall sections in such a manner that said projections means on the respective support wall sections are fitted respectively into said bores in the respective axial end faces of said recoiler core.

15. A cassette for accommodating therein a photosensitive recording medium in the form of a continuous web wound into a roll, said cassette comprising:
a pair of cassette halves formed of a synthetic resin, said pair of cassette halves being united together to form a cassette body having defined therein an accommodating chamber for said recording medium;
a drawing opening formed in an outer surface of said cassette body;
an optically inert feed passage defined by cooperation of a wall section of one of said pair of cassette halves with a wall section of the other of said pair of cassette halves when said cassette halves are united together, said feed passage having one end thereof communicating with said accommodating chamber and the other end communicating with said drawing opening, said recording medium continuous web having a leading edge portion which extends from said accommodating chamber to said drawing opening through said feed passage;
a pair of opposed, spaced apart support wall sections of said cassette body and a connecting wall section extending between said pair of support wall sections for connecting them to each other, said spaced apart wall sections cooperating to define therebetween an open space; and
a recoiler core for taking up a used portion of said continuous web disposed in said open space, said recoiler core having an axis extending parallel to an axis of said roll and having its opposite axial ends rotatably supported by said pair of support wall sections.

16. The cassette according to claim 15, wherein said pair of support wall sections and said connecting wall section are formed in integral relation to one of said pair of cassette halves.

17. A cassette for accommodating therein a photosensitive recording medium, said cassette comprising:
a pair of cassette halves formed of a synthetic resin, said pair of cassette halves being united together to form a cassette body having defined therein an accommodating chamber for said recording medium;
a drawing opening formed in an outer surface of said cassette body, said recording medium being drawn out of said accommodating chamber through said drawing opening:
an optically inert feed passage defined by cooperation of a wall section of one of said pair of cassette halves with a wall section of the other of said pair of cassette halves when said cassette halves are united together, said feed passage having one end thereof communicating with said accommodating chamber and the other end communicating with said drawing opening such that said recording medium passes through said feed passage when said recording medium is drawn out of said accommodating chamber through said drawing opening; and
diffused-reflection means associated with said feed passage for diffusedly reflecting light penetrated into said feed passage through said drawing opening, thereby attenuating the light, said diffused-reflection means being arranged adjacent said one end of said feed passage so as to be illuminated directly with light penetrating into said feed passage through said drawing opening.

18. A cassette for accommodating therein a photosensitive continuous web wound in a roll, which comprises:
a cassette body having an acommodating chamber therein for accommodating said continuous web;
an optically inert feed passage defined by cooperation of a pair of feed wall sections of said cassette body;
a drawing opening formed on said cassette body at the outer end of said feed passage, said continuous web having a leading edge portion which extends form said accommodating chamber to said drawing opening through said feed passage; and
a recoiler core for taking up a used portion of said continuous web, said recoiler core having an axis extending parallel to an axis of said roll, aid cassette body having a pair of opposed, but spaced support wall sections which cooperate with each other to define therebetween an open space, said recoiler core having opposite axial ends rotatably supported respectively by said pair of support wall sections, said cassette body having a connecting wall section extending between said pair of support wall sections for connecting them to each other;

wherein said feed passage having one end thereof communicating with said accommodating chamber and the other end communicating with said drawing opening such that said continuous web passes through said feed passage when said continuous web is drawn out of said accommodating chamber through said drawing opening.

19. A cassette for accommodating therein a photosensitive continuous web wound in a roll, which comprises:

a cassette body having an accommodating chamber therein for accommodating said continuous web;

an optically inert feed passage defined by cooperation of a pair of feed wall sections of said cassette body;

a drawing opening formed on said casseftte body at the outer end of said feed passage, said continuous web having a leading edge portion which extends from said accommodating chamber to said drawing opening through said feed passage; and a recoiler core for taking up a used portion of said continuous web, said recoiler core having an axis extending parallel to an axis of said roll, said cassette body having a pair of opposed, but spaced support wall sections which cooperate with each other to define therebetween an open space, said recoiler core having opposite axial ends rotatably supported respectively by said pair of support wall sections;

wherein said feed passage having one end thereof communicating with said accommodating chamber and the other end communicating with said drawing opening such that said continuous web passes through said feed passage when said continuous web is drawn out of said accommodating chamber through said drawing opening.

* * * * *